(12) United States Patent
Chung et al.

(10) Patent No.: US 7,577,020 B2
(45) Date of Patent: Aug. 18, 2009

(54) SYSTEM AND METHOD FOR READING MULTIPLE MAGNETIC TUNNEL JUNCTIONS WITH A SINGLE SELECT TRANSISTOR

(76) Inventors: Shine Chung, No. 19, $2^{nd}$ FL, 64 Alley, Fu De N. Rd., Sanchong, Taipei, Hsien (TW); Denny Tang, 20407 Cuningham Pl., Saratoga, CA (US) 95070; Fu-Lung Hsueh, 9, Creation Rd. 1, Hsinchu Science Park, Hsinchu (TW) 300-77

( * ) Notice: Subject to any disclaimer, the term of this patent is extended or adjusted under 35 U.S.C. 154(b) by 179 days.

(21) Appl. No.: 11/865,481

(22) Filed: Oct. 1, 2007

(65) Prior Publication Data
US 2009/0086530 A1  Apr. 2, 2009

(51) Int. Cl.
G11C 11/00 (2006.01)
G11C 11/15 (2006.01)
G11C 15/00 (2006.01)

(52) U.S. Cl. .......... 365/158; 365/171; 365/173; 365/148; 365/189.07; 365/189.15

(58) Field of Classification Search .............. 365/158, 365/157, 173, 49.13, 171, 148, 189.15, 189.07
See application file for complete search history.

(56) References Cited

U.S. PATENT DOCUMENTS 6,909,631 B2 * 6/2005 Durlam et al. .............. 365/158
7,082,056 B2 * 7/2006 Chen et al. ............... 365/185.2

* cited by examiner

Primary Examiner—J. H. Hur
Assistant Examiner—Tha-O Bui (57) ABSTRACT

A method for reading two or more magnetic tunnel junctions (MTJs) which are serially connected with a select transistor to form a memory string, the method comprises turning on the select transistor, measuring a first resistance of the memory string, storing the first resistance, toggling a predetermined one of the MTJs, measuring a second resistance of the memory string after the toggling, toggling back the predetermined one of the MTJs and comparing the first and second resistances with a plurality of predetermined resistance values, wherein the comparison result leads to a determination of the data stored in the MTJs.

24 Claims, 9 Drawing Sheets

SYSTEM AND METHOD FOR READING MULTIPLE MAGNETIC TUNNEL JUNCTIONS WITH A SINGLE SELECT TRANSISTOR

BACKGROUND

The present invention relates generally to magnetoresistive random access memory (MRAM), and more particularly to core structure designs of the MRAM.

MRAM combines magnetic memory elements with standard silicon-based integrated circuits to obtain the combined attributes of non-volatility, high-speed operation and unlimited read and write endurance not found in any other existing memory technology. Each memory element in a MRAM uses a magnetic tunnel junction (MTJ) device for data storage. The MTJ is composed of a fixed magnetic layer set to a particular polarity, a thin dielectric tunnel barrier, and a free magnetic layer with a field changes to match that of an external field. When a bias is applied to the MTJ, electrons that are spin polarized by the magnetic layers traverse the dielectric barrier through a process known as tunneling. The MTJ device has a low resistance when the magnetic moment of the free layer is parallel to the fixed layer and a high resistance when the free layer moment is oriented anti-parallel to the fixed layer moment.

Figure 1:
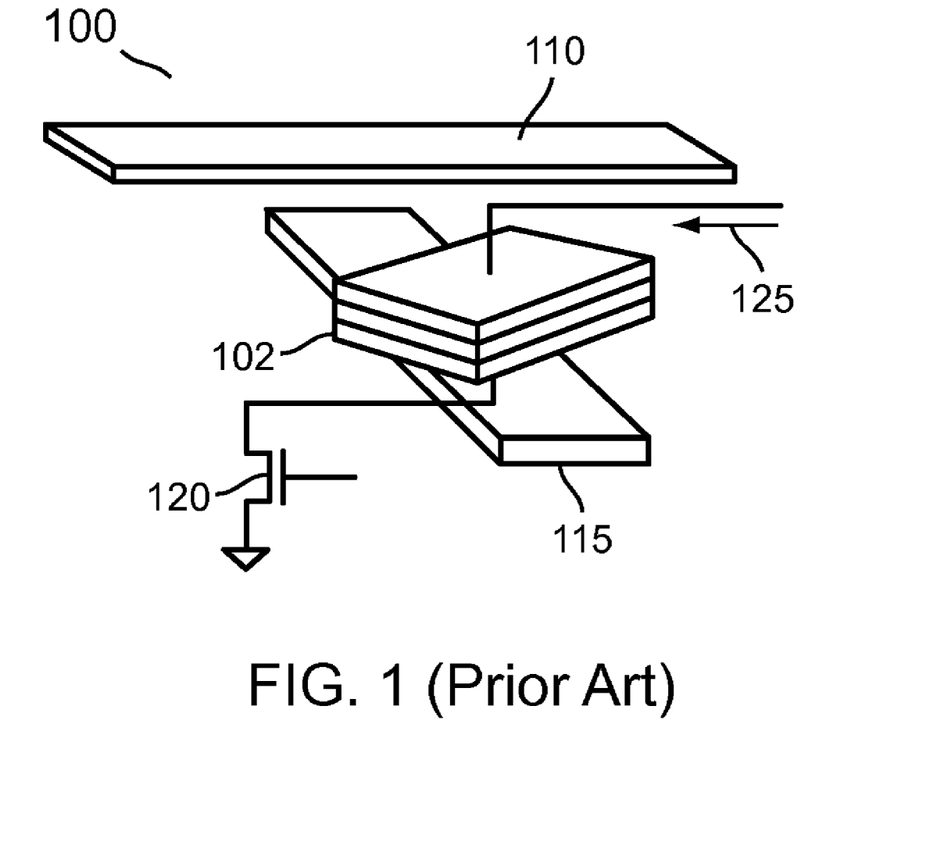
FIG. 1 shows a conventional 1-transistor, 1-magnetic-tunnel junction (1T1MTJ) MRAM cell.

FIG. 1 shows a conventional 1-transistor, 1-magnetic-tunnel junction (1T1MTJ) MRAM cell 100. A MTJ 102 is sandwiched between two write lines (WLs) 110 and 115. When currents with right timing run through both the WLs 110 and 115, the field of the fixed magnetic layer in the MTJ 102 can be altered, therefore a desired data is written into the MTJ 102. The MTJ 102 is read by measuring its resistance. One way to measure the resistance is to turn on a NMOS select transistor 120 and let a reference current 125 pass through the MTJ 102, a resulting voltage from the MRAM cell 100 is compared with a reference cell (not shown) to get a logic "1" or "0" reading.

Unlike most other semiconductor memory technologies, the data is stored in the MRAM as a magnetic state, rather than charge, and sensed by measuring the resistance without disturbing the magnetic state. Using a magnetic state for storage has two main benefits: (1) The magnetic polarization does not leak away with time like charge does, so the information is stored even when the power is turned off; and (2) switching the magnetic polarization between the 2 states does not involve actual movement of electrons or atoms and thus has no known wear-out mechanism.

"Toggle" approach is using the same pulse sequence to write from logic "0" state to "1" state, and for "1" state to "0". Each time the sequence is executed the device changes from its current magnetic state to the opposite state. This type of switching is significantly different from the simple type of switching where the magnetic moment of the free layer simply follows the applied field. When using the toggle writing method, there is a need to determine the initial state of the MRAM device before writing, because if the initial state is the same as the target state, no toggling will be need, otherwise, a toggling will be performed on the MRAM device.

Figure 2:
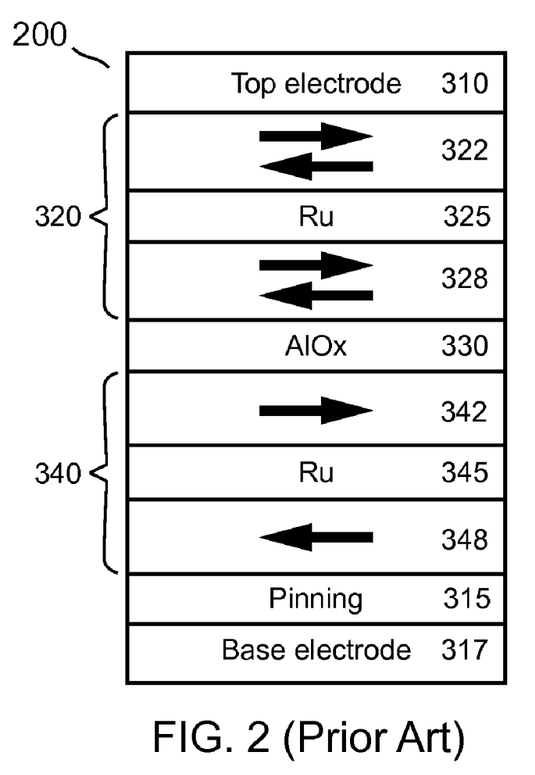
FIG. 2 illustrates a toggle mode MRAM cell.

FIG. 2 illustrates a toggle mode MRAM cell 200 that utilizes a unique behavior of a synthetic antiferromagnet (SAF) free-layer 320 formed from two ferromagnetic layers 322 and 328 separated by a non-magnetic coupling spacer layer 325. The magnetic moments of the SAF free-layer 320 switch between two states when the proper magnetic field sequence is applied. The MRAM cell 200 comprises a SAF fixed layer 340 formed also from two ferromagnetic layers 342 and 348 separated by a non-magnetic coupling spacer layer 345. A tunnel barrier 330, made of alumina (AlOx) for instance, is sandwiched between these two SAF layers 320 and 340. The SAF layers 320 and 340 and the tunnel barrier 330 form the core of the tri-layer MRAM cell.

Figure 3:
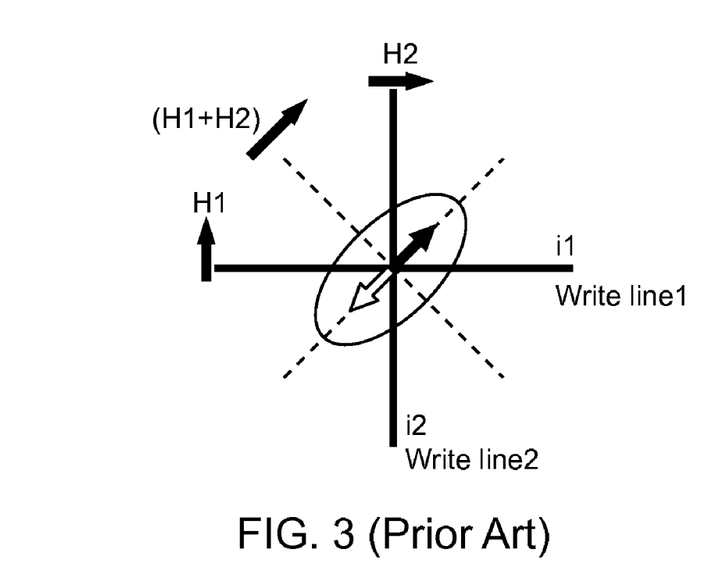
FIG. 3 shows the field sequences used to switch the free layer in the MRAM cell from one state to the other.

Referring again to FIG. 2, the bottom ferromagnetic layer 328 of the SAF free-layer 320 is often called a sense layer, and the top ferromagnetic layer 342 of the SAF fixed layer 340 is often called a reference layer. Electrons tunnel across the alumina tunnel barrier 330, resulting in a magnetoresistance that is sensitive to the magnetic moment direction of the sense layer 328 relative to the reference layer 342. The moment-balanced SAF free-layer 320 responds to an applied magnetic field differently than the single ferromagnetic layer of conventional MRAM. Rather than following an applied magnetic field, the two antiparallel layer magnetizations will rotate to be approximately orthogonal to the applied field. A current pulse sequence is used to generate a rotating magnetic field that moves the free-layer moments through the 180-degree switch from one state to the other, as shown in FIG. 3, wherein magnetic fields, H1, (H1+H2) and H2, are produced by passing currents, i1 and i2, through write line1 and write line2, respectively.

Figure 4:
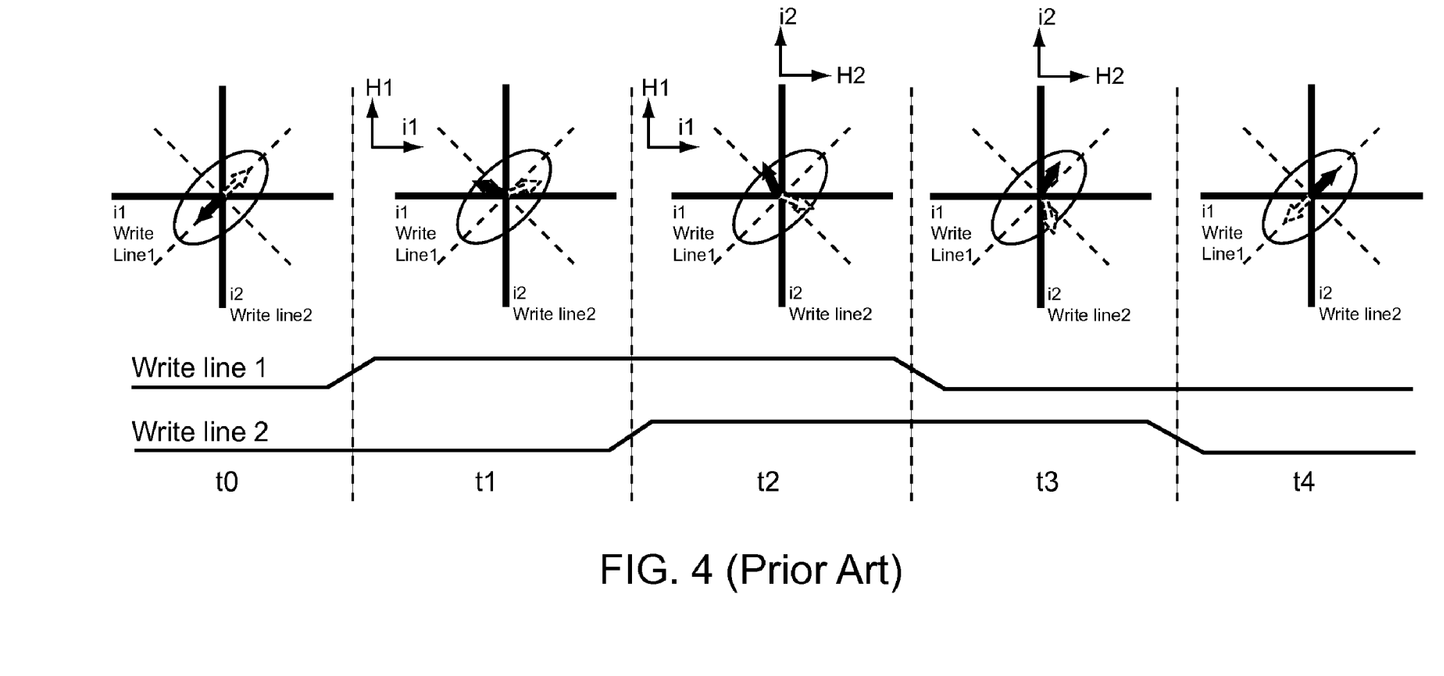
FIG. 4 illustrates the toggle write mode for writing a "1" to a "0" using current pulse sequence.

FIG. 4 illustrates the toggle write mode for writing a "1" to a "0" using current pulse sequence. In this illustration at time t0, magnetic moment vectors are oriented in the preferred directions. This orientation will be defined as a logic "1".

At a time t1, a positive write word current is turned on, which induces H1 to be directed in the positive y-direction. The effect of positive H1 is to cause the nearly balanced anti-aligned MRAM tri-layer to orient toward the applied field direction. The finite anti-ferromagnetic exchange interaction between ferromagnetic layers (top free-layer 322 and bottom free-layer 328, see FIG. 3) will allow magnetic moment vectors to now deflect at a small angle toward the magnetic field direction and resultant magnetic moment vector (H2) will subtend the angle between magnetic moment vectors and will align with H1. Hence, magnetic moment vector of the bottom free-layer 328 is rotated in clockwise direction. Since resultant magnetic moment vector is the vector addition of magnetic moment vectors, magnetic moment vector is also rotated in clockwise direction.

At a time t2, positive write bit current is turned on, which induces positive direction on an easy axis which is at a 45° angle relative to the positive y- and positive x-directions. Consequently, resultant magnetic moment vector is being simultaneously directed in the positive y-direction by H1 and the positive x-direction by the direction of H1 and H2, which has the effect of causing effective magnetic moment vector to further rotate in clockwise direction until it is generally oriented at a 45° angle between the positive x- and positive y-directions. Consequently, magnetic moment vectors will also further rotate in clockwise direction.

At a time t3, write word current is turned off so that now only H2 is directing resultant magnetic moment vector, which will now be oriented in the positive x-direction. Both magnetic moment vectors will now generally be aligned with respect to this magnetic field.

At a time t4, write bit current is turned off so a magnetic field force is not acting upon resultant magnetic moment vector. Consequently, magnetic moment vectors will become oriented in their nearest preferred directions to minimize the energy. In this case, the preferred direction for magnetic moment vector is at a 45° angle relative to the positive y- and positive x-directions. This preferred direction is also 180° from the initial direction of magnetic moment vector at time t0 and is defined as "0". Hence, the MRAM cell has been switched to a logic "0".

Figure 5:
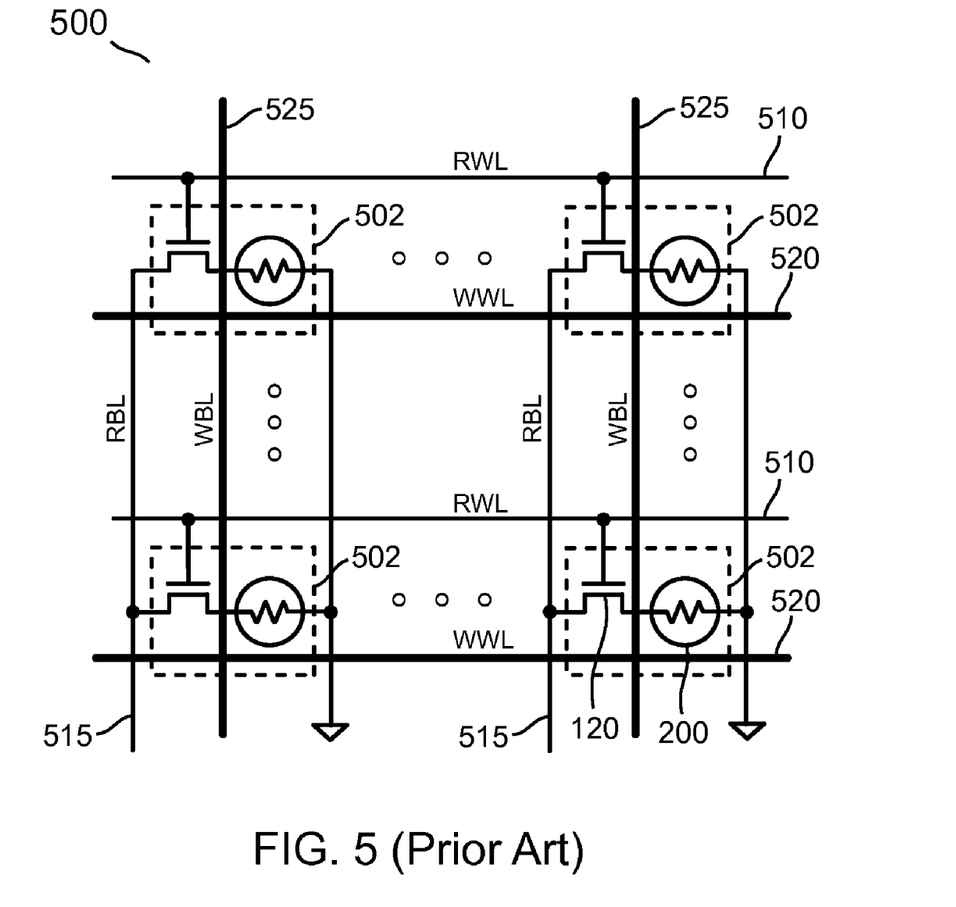
FIG. 5 is a schematic diagram illustrating a plurality of the MRAM cells arranged in an array.

FIG. 5 is a schematic diagram illustrating a plurality of the MRAM cells 200 arranged in an array with each write line spanning hundreds or even thousands of bits in making a conventional high density MRAM 500. Each MRAM cell 200 is serially connected with a NMOS select transistor 120 forming a storage unit 502. For reading, each storage unit 502 is connected to a read-word-line (RWL) 510 and a read-bit-line (RBL) 515, wherein the RWL 510 is connected to a gate of the NMOS select transistor 120, and the RBL 515 is connected to a drain of the NMOS select transistor 120. During a read operation, a select transistor 120 of a target storage unit 502 is turned on to bias the corresponding MRAM cell 200 and a resulting current is compared to a reference to determine if a resistance state of the target MRAM cell 200 is the logic "0" or "1". For writing, a write-word-line (WWL) 520 runs through a row of the MRAM cells 200, and a write-bit-line (WBL) 525 runs through a column of the MRAM cells 200. During a write operation, current pulses are passed through the WWL 520 and WBL 525 writing only the MRAM cell 200 at the cross point of the WWL 520 and WBL 525.

Referring again to FIG. 5, with the select transistor 120, each individual storage unit 502 in the conventional MRAM 500 is directly readable. However, the numerous select transistors 120 and the RBLs 515 has a penalty on the die size, and hence the cost of the conventional MRAM 500.

As such, what is desired is a MRAM array architecture with reduced components, yet still maintains accessibility to each individual cells.

SUMMARY

In view of the foregoing, the present invention provides a method for reading two or more magnetic tunnel junctions (MTJs) which are serially connected with a select transistor to form a memory string, the method comprises turning on the select transistor, measuring a first resistance of the memory string, storing the first resistance, toggling a predetermined one of the MTJs, measuring a second resistance of the memory string after the toggling, toggling back the predetermined one of the MTJs and comparing the first and second resistances with a plurality of predetermined resistance values, wherein the comparison result leads to a determination of the data stored in the MTJs.

In another aspect, the present invention provides a memory device which comprises a plurality of magnetic tunnel junctions (MTJs) and a select transistor connected in series to form a memory string, a resistance sensing circuit coupled to the memory string for measuring a resistance level thereof, an address decoder coupled to a gate of the select transistor for selectively engaging the memory string to the resistance sensing circuit, a toggle control circuit configured to selectively toggle at least one of the plurality of MTJs after a first measurement of the resistance level of the memory string and toggle back the at least one of the plurality of MTJs after a second measurement of the resistance level of the memory string, and a logic control circuit coupled to the resistance sensing circuit and the toggle control circuit, and being configured to compare both the first and second measured resistances with a plurality of predetermined resistance values and to use the comparison result to determine the data stored in the memory string.

The construction and method of operation of the invention, however, together with additional objects and advantages thereof will be best understood from the following description of specific embodiments when read in connection with the accompanying drawings.

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The following will provide a detailed description of a system and method for constructing a toggle-mode magnetoresistive random access memory (MRAM) with multiple magnetic tunnel junctions (MTJs) sharing a single select transistor, therefore, the MRAM array size can be reduced.

Figure 6:
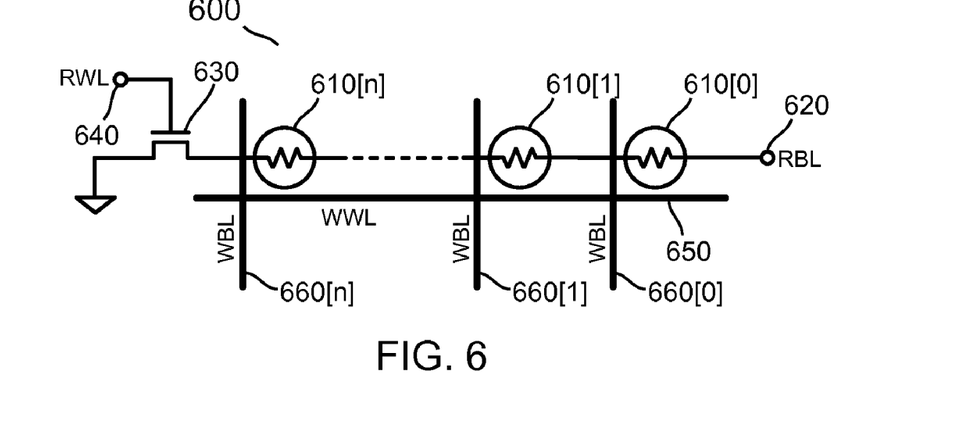
FIG. 6 is a schematic diagram illustrating a plurality of serially connected MTJs sharing a single select transistor according to an embodiment of the present invention.

FIG. 6 is a schematic diagram illustrating such a MRAM 600 as an embodiment of the present invention. A plurality of MTJs 610[0:n] are serially connected to a read bit-line (RBL) 620 on one end and to a drain of a select transistor 630 on the other end. The connections are made by low resistance materials such as metal, as well as contacts and vias. A source of the select transistor 630 is coupled to a ground. A gate of the select transistor 630 is coupled to a read word-line (RWL) 640. The RBL 620 is coupled to a resistance measurement circuit (not shown) and a total resistance of the plurality of the MTJs 610[0:n] can be measured when the selected transistor 630 is turned on by the RWL 640. The plurality of MTJs 610[0:n] are writable or can be toggled by a write word-line (WWL) 650 and a plurality of write bit-lines 660[0:n]. For example, when toggling the MTJ 610[1], currents are simultaneously applied to WWL 650 and WBL 660[1]. Therefore, the plurality of MTJs 610[0:n] can be individually written or toggled as conventional toggle-mode MRAMs. However, as a result of the multiple serially connected MTJs 610[0:n] sharing a single select transistor 640, reading the MRAM 600 requires special methods.

Figure 7:
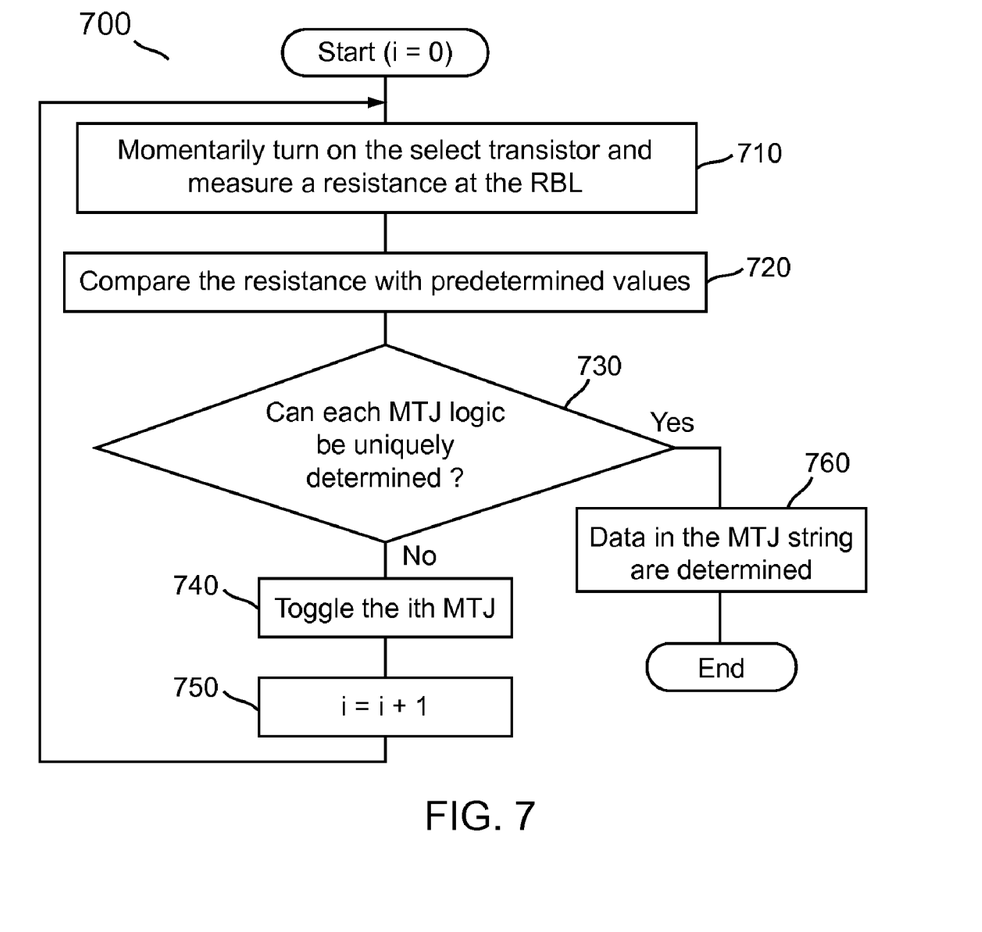
FIG. 7 is a flow chart illustrating a reading method 700 for the MRAM of FIG. 6 according to the embodiment of the present invention.

FIG. 7 is a flow chart illustrating a reading method 700 for the MRAM 600 of FIG. 6 according to the embodiment of the present invention. The reading method 700 begins with setting i=0, where i indexes to an ith MTJ 610[i] ($0 \leq i \leq n$). Referring again to FIG. 6, for measuring the total resistance of the serially connected MTJs 610[0:n], the select transistor 640 is turned on momentarily in step 710. The measured total resistance is then compared with a plurality of predetermined resistance values to find a match in steps 720 and 730. As part of a memory array, the MTJs 610[0:n] are designed and manufactured substantially identical to each other. Each MTJ 610[i] has a high resistance, R_H, representing the logic "1", when the free layer magnetic moment is oriented anti-parallel to the fixed layer magnetic moment, and has a low resistance, R_L, representing the logic "0", when the magnetic moment of the free layer is parallel to the fixed layer. If all the MTJs 610[0:n] are in high resistance state, then the total resistance equals to (n+1)*R_H. On the other hand, if all the MTJs 610[0:n] are in low resistance state, then the total resistance equals to (n+1)*R_L. When the measured resistance substantially equals to (n+1)*R_H, then data stored in the MTJs 610[0:n] are all logic "1s". On the other hand, if the measured resistance substantially equals to (n+1)*R_L, then the data stored in the MTJs 610[0:n] are all logic "0s". If some of MTJs 610[0:n] are in the high resistance state and the others are in the low resistance state, the total resistance measured will be a value between (n+1)*R_H and (n+1)*R_L, such as [n*R_H+R_L] for only one MTJ in low resistance state and [(n−1)*R_H+2*R_L] for only two MTJs in low resistance state. If more than one data stored in the MTJs 610[0:n] could yield the total resistance measured, then the current reading is inconclusive, and a toggling of the ith MTJ 610[i] will be needed in step 740. Subsequently, the index, i, will be incremented in step 750, and the process repeats steps 710, 720 and 730 as described above. As more MTJs are toggled, eventually all the possible combinations of the MTJ 610[0:n] states, or data, may find a unique match between the total resistance measured and the predetermined resistance values, i.e., [(n+1−i)*R_H+i*R_L], where i equals to the number of MTJs being in the low resistance state. Then the data stored in the MTJs 610[0:n] are determined in step 760 which ends the current reading thereof. Apparently, one having skills in the art would recognize that n number of toggles would be needed to exhaust all $2^{n+1}$ possible combinations of the MTJ 610[0:n] states, i.e., for the (n+1) bits serially connected MTJs 610[0:n], a maximum n number of toggle-and-measurements can read out the data. Besides, for the method 700 to work properly, the resistance value of each MTJs 610[0:n] must satisfy equation: (n+1)*R_L<<n*R_L+R_H.

The method 700 may be better understood through examples where the number of MTJs, n, has a certain value. A simplest example would be for n=1, i.e., there are only two MTJs, MTJ[0] and MTJ[1], serially connected in the MTJ string. Following TABLE 1 illustrates a pre-toggle first time resistance measurement results for four possible bit combinations, case[0:3]. Case[0] is for both MTJ[1] and MTJ[0] storing a logic "0", and the total resistance measured is 2*R_L, which is unique among the four cases, therefore case[0] is conclusive after the first measurement. Similarly, case[3] is for both MTJ[1] and MTJ[0] storing a logic "1", and the total resistance measured is 2*R_H, which is also unique, and resulting in case[3] also conclusive after the first measurement. Both case[1] and case[2] have one logic "1" and one logic "0", and their total resistances are both at R_H+R_L, therefore, an exact data stored in the MTJ string is inconclusive after the first measurement, and a toggling and another measurement will be needed.

TABLE 1

| Pre-toggle | MTJ[1] | MTJ[0] | Total resistance measured | |
|---|---|---|---|---|
| Case[0] | 0 | 0 | 2 * R_L | conclusive |
| Case[1] | 0 | 1 | R_H + R_L | inconclusive |
| Case[2] | 1 | 0 | R_H + R_L | inconclusive |
| Case[3] | 1 | 1 | 2 * R_H | conclusive |

Following TABLE 2 illustrates toggling MTJ[1] for determining case[1] or case[2]. After the toggling, case[1] yields a unique 2*R_H resistance. Similarly, case[2] yields also a unique 2*R_L resistance. Therefore, after just one toggle, all four possible cases of the two bit MTJ string can be determined.

TABLE 2

| 1st toggle | MTJ[1] toggled | MTJ[0] | Total resistance measured | |
|---|---|---|---|---|
| Case[1] | 0 → 1 | 1 | 2 * R_H | conclusive |
| Case[2] | 1 → 0 | 0 | 2 * R_L | conclusive |

Next, n=2 or a three-bit MTJ string is examined. Following TABLE 3 illustrates a pre-toggle resistance measurement result, where only case[0] and case[7] yield unique resistance value and being conclusive. For the non-conclusive cases [1:6], more togglings will be needed.

TABLE 3

| Pre-toggle | MTJ[2] | MTJ[1] | MTJ[0] | Total resistance measured | |
|---|---|---|---|---|---|
| Case[0] | 0 | 0 | 0 | 3 * R_L | conclusive |
| Case[1] | 0 | 0 | 1 | R_H + 2 * R_L | inconclusive |
| Case[2] | 0 | 1 | 0 | R_H + 2 * R_L | inconclusive |
| Case[3] | 0 | 1 | 1 | 2 * R_H + R_L | inconclusive |
| Case[4] | 1 | 0 | 0 | R_H + 2 * R_L | inconclusive |
| Case[5] | 1 | 0 | 1 | 2 * R_H + R_L | inconclusive |
| Case[6] | 1 | 1 | 0 | 2 * R_H + R_L | inconclusive |
| Case[7] | 1 | 1 | 1 | 3 * R_H | conclusive |

Following TABLE 4 illustrates a partial truth table for MTJ[2] being toggled. After the 1st toggling, the total resistance measured for case[3] or case[4] are unique, i.e., the MTJ string stores a "011" (case[3]) when the total resistance measured after the 1st toggling equals to 3*R_H, or a "100" (case[4]) when the total resistance measured after the 1st toggling equals to 3*R_L. Case[1:2] and case[5:6] still are not unique, and require another toggling. TABLE 5 illustrates the total resistance measured for the remaining cases, each of which is unique, after a toggling of MTJ[1]. When the total resistance is 3*R_H after the 2nd toggling, the original data stored in the MTJ string is "001" (case[1]). When the total resistance is R_H+2*R_L, the original data stored in the MTJ string is "010" (case[2]). When the total resistance is 2*R_H+R_L, the original data stored in the MTJ string is "101" (case[5]). When the total resistance is 3*R_L, the original data stored in the MTJ string is "110" (case[6]). Therefore, after maximum two toggles, data stored in the three-bit MTJ string can be determined.

TABLE 4

| 1st toggle | MTJ[2] toggled | MTJ[1] | MTJ[0] | Total resistance measured | |
|---|---|---|---|---|---|
| Case[1] | 0 → 1 | 0 | 1 | 2 * R_H + R_L | inconclusive |
| Case[2] | 0 → 1 | 1 | 0 | 2 * R_H + R_L | inconclusive |
| Case[3] | 0 → 1 | 1 | 1 | 3 * R_H | conclusive |
| Case[4] | 1 → 0 | 0 | 0 | 3 * R_L | conclusive |
| Case[5] | 1 → 0 | 0 | 1 | R_H + 2 * R_L | inconclusive |
| Case[6] | 1 → 0 | 1 | 0 | R_H + 2 * R_L | inconclusive |

TABLE 5

| 2nd toggle | MTJ[2] toggled | MTJ[1] toggled | MTJ[0] | Total resistance measured | |
|---|---|---|---|---|---|
| Case[1] | 0 → 1 | 0 → 1 | 1 | 3 * R_H | conclusive |
| Case[2] | 0 → 1 | 1 → 0 | 0 | R_H + 2 * R_L | conclusive |
| Case[5] | 1 → 0 | 0 → 1 | 1 | 2 * R_H + R_L | conclusive |
| Case[6] | 1 → 0 | 1 → 0 | 0 | 3 * R_L | conclusive |

Although the toggling of the above two-bit and three-bit exemplary MTJ strings always start from the most-significant bit and the second toggling bit is a next-significant bit, one having skills in the art would realize that the toggling sequence does not matter, as long as toggling one bit at a time and at least n−1 number of toggles are performed, all the possible combinations of the MTJ bits can be determined. Apparently, the above measuring-toggling-and-measuring method can be expanded to a 4-bit MTJ string and beyond. One having skills in the art may also realize that the toggling sequence, i.e., MTJ[2]→MTJ[1]→MTJ[0], does not matter, as long as the system stores correct value vs. case information.

Figure 8A:
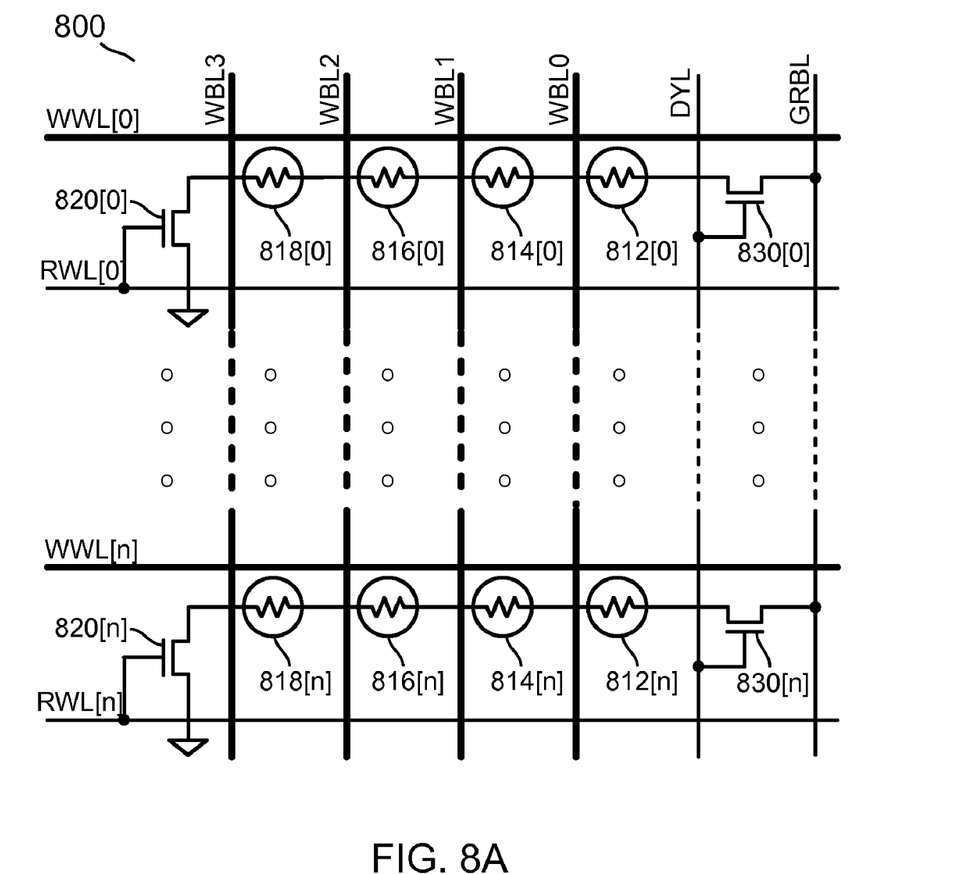
FIGS. 8A and 8B are schematic diagrams illustrating exemplary MRAM arrays implementing the serially connected MTJs.
Figure 8B:
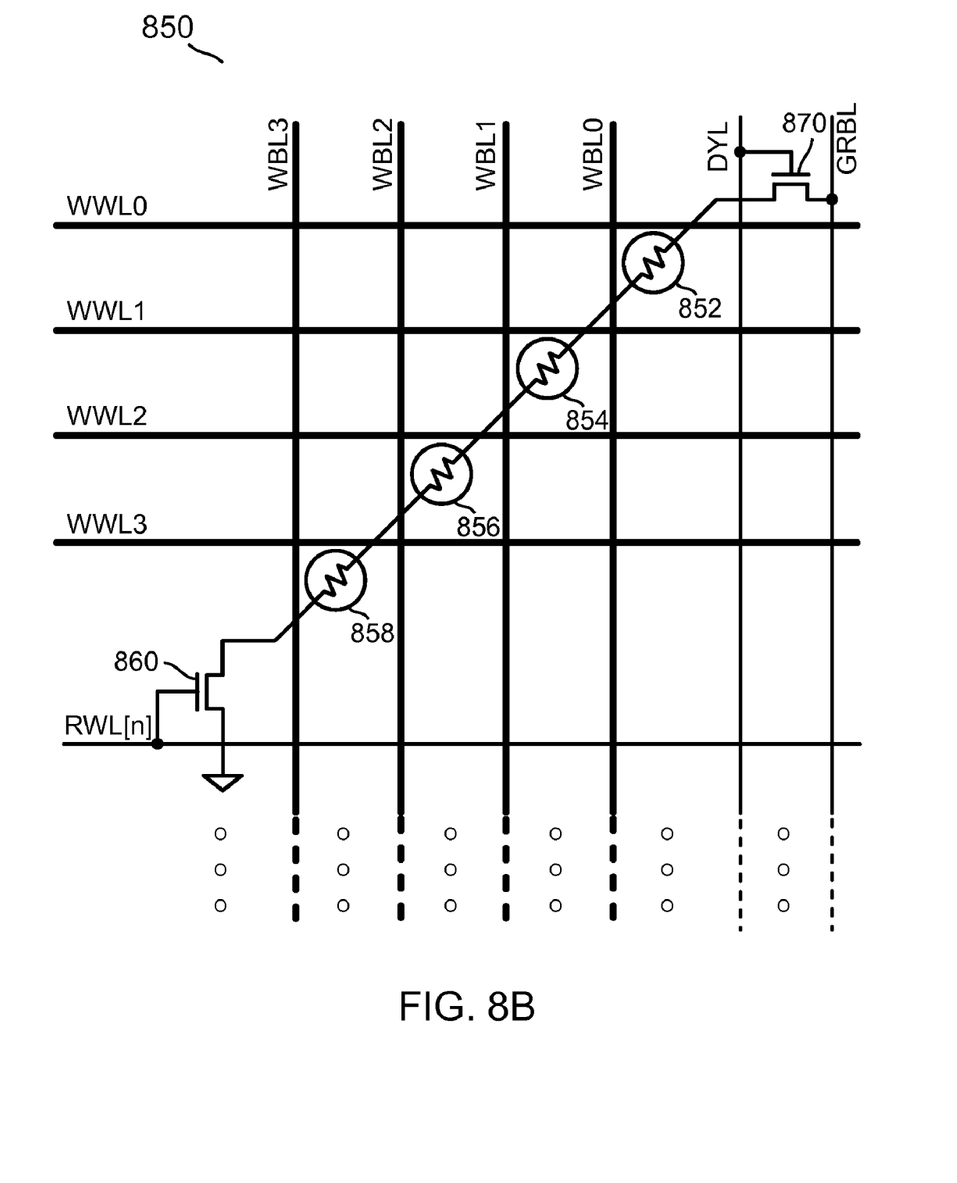

FIGS. 8A and 8B are schematic diagrams illustrating exemplary MRAM arrays 800 and 850 implementing four serially connected MTJs. Referring to FIG. 8A, the MRAM array 800 comprises (n+1) number of rows of MTJ strings, and each row has four MTJs connected in series between a select transistor 820[i] and a decoder transistor 830[i], where i is an integer between 0 and n. MTJs on a row share a write word-line (WWL). MTJs on a column share a write bit-line (WBL). Using the first row as an example, four MTJs 812[0], 814[0], 816[0] and 818[0] are serially connected between the select transistor 820[0] and the decoder transistor 830[0]. A source of the select transistor 820[0] is connected to the ground. The connections between the MTJs 812[0], 814[0], 816[0], 818[0] and the select transistor, and the connection to the ground are typically made by metal interconnections, contacts and vias to reduce their resistance and to keep the resistance relatively constant among all the rows of the MRAM array 800. A gate of the select transistor 820[0] is coupled to a read word-line RWL[0] for selectively reading a particular row of MTJs. A function of the decoder transistor 830[0] is to determined either a left hand side MTJ string or a right hand side MTJ string (not shown) to be coupled to a global read bit-line (GRBL). A Y or column decoder line (DYL) controls the on-or-off of the decoder transistor 830[0].

The writing or toggling path of the MRAM cell 800 is independent of the reading path. For toggling the MTJ 814[0], for instance, current pulses will be passed to the WWL[0] and WBL2 in a timing relationship described in FIG. 4.

Referring to FIG. 8B, the MRAM array 850 is represented a diagonal string comprising four serially connected MTJs 852, 854, 856 and 858. Reading the diagonal MTJ string requires momentarily turning on a select transistor 860 by a read word-line (RWL), and simultaneously turning on a decoder transistor 870 by a column decoder line (DYL). This reading process is substantially the same as reading the MRAM 800. But writing or toggling of the MRAM array 850 is rather different. Toggling any one of the MTJs requires a unique pair of write word-line (WWL) and write bit-line (WBL). For instance, in order to toggle the MTJ 854, WWL1 and WBL1 need to be activated, while toggling the MTJ 858 requires WWL3 and WBL3 to be activated. The exemplary MRAM array 850 shown in FIG. 8B demonstrates the inventive serial MTJ strings may be applied in various forms yet still maintain the same functionality, i.e., the method 700 as shown in FIG. 7 can be applied to them. One having skills in the art may even realize that the select transistor 630 of FIG. 6, 820[0:n] of FIG. 8A or 860 of FIG. 8B need to be placed between the MTJ string and the ground, instead, the select transistor may be placed in the middle or on the read bit-line side and in serial connection with the MTJ string, and the total resistance of the MTJ string can be measured just the same.

Figure 9A:
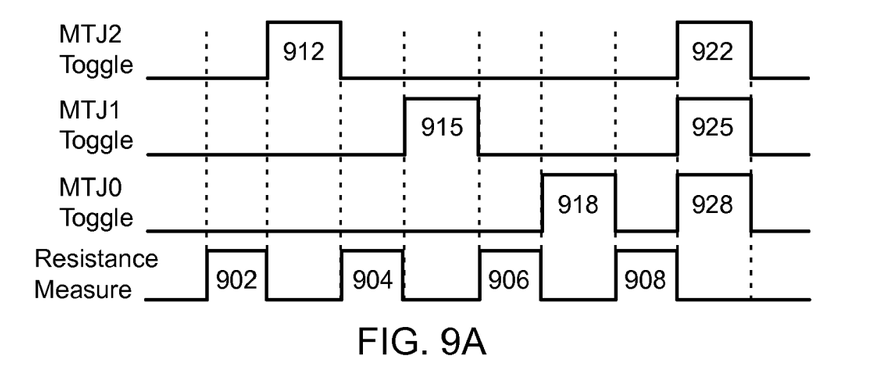
FIGS. 9A, 9B and 9C are timing waveforms illustrating toggling sequences for the aforementioned MRAM arrays.
Figure 9B:
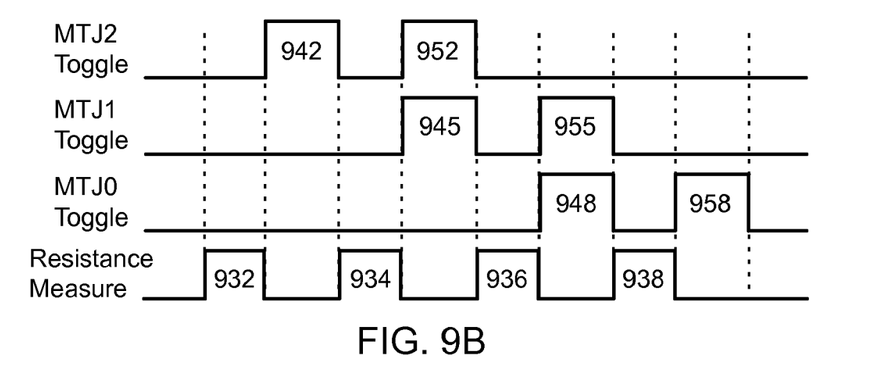
Figure 9C:
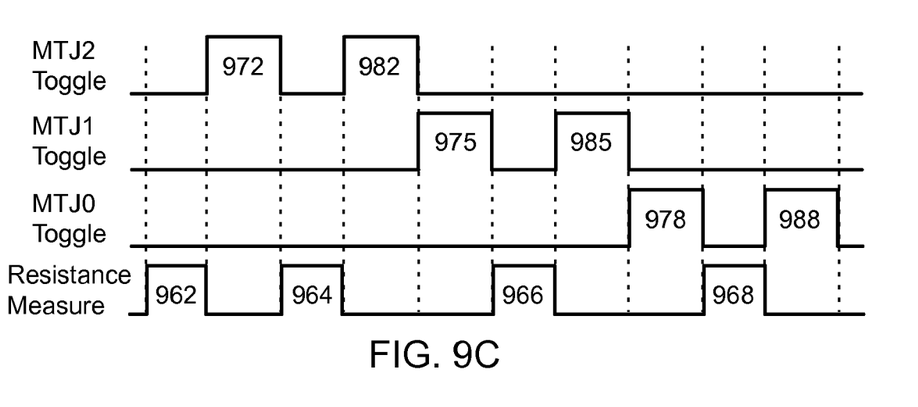

However, there is an issue with the reading process described by method 700, as the reading process involves toggling which alters the data stored in the MTJ string. In order to restore the original data, a toggle back cycle is needed for those toggled MTJs. FIGS. 9A, 9B and 9C are timing waveforms illustrating toggling sequences for the aforementioned MRAM arrays 800 and 850 of FIGS. 8A and 8B respectively, wherein a toggle-back is applied for every read toggling.

Referring to FIG. 9A, pulses 902 is a pre-toggle resistance measurement time, and pulses 904, 906 and 908 are resistance measurement time after each toggle. For the 4-bit MTJ strings shown in FIGS. 8A and 8B, maximum three toggles, pulses 912, 915 and 918, will be needed. Toggle-back pulses 922, 925 and 928 are applied simultaneously after the completion of all the toggling-measurements. Truth tables similar to TABLEs 3 through 5 may be applied in this case.

Referring to FIG. 9B, pulse 932 is a pre-toggle measurement time, and pulses 934, 936 and 938 are post-toggle measurement time. Toggle-back pulses 952, 955 and 958 are applied right after their respective toggle pulses 942, 945 and 948. The toggle-back pulse 952 is in fact overlapping a next toggle pulse 945, so does the toggle-back pulse 955 and a next toggle pulse 948. Since a previous MTJ bit is already toggled back before a next measurement, a different truth table will be needed to extract data from the MTJ string. TABLE 6 shows a truth table of a pre-toggle measurement result. Only case[0] or case[15], i.e., the MTJ stores a "0000" or "1111", are conclusive after the pre-toggle measurement. For rest of the 16 cases, more toggling will be needed.

TABLE 6

| Pre-toggle | MTJ[3] | MTJ[2] | MTJ[1] | MTJ[0] | Total resistance measured | |
|---|---|---|---|---|---|---|
| Case[0] | 0 | 0 | 0 | 0 | 4 * R_L | conclusive |
| Case[1] | 0 | 0 | 0 | 1 | R_H + 3 * R_L | inconclusive |

TABLE 6-continued

| Pre-toggle | MTJ[3] | MTJ[2] | MTJ[1] | MTJ[0] | Total resistance measured | |
|---|---|---|---|---|---|---|
| Case[2] | 0 | 0 | 1 | 0 | R_H + 3 * R_L | inconclusive |
| Case[3] | 0 | 0 | 1 | 1 | 2 * R_H + 2 * R_L | inconclusive |
| Case[4] | 0 | 1 | 0 | 0 | R_H + 3 * R_L | inconclusive |
| Case[5] | 0 | 1 | 0 | 1 | 2 * R_H + 2 * R_L | inconclusive |
| Case[6] | 0 | 1 | 1 | 0 | 2 * R_H + 2 * R_L | inconclusive |
| Case[7] | 0 | 1 | 1 | 1 | 3 * R_H + R_L | inconclusive |
| Case[8] | 1 | 0 | 0 | 0 | R_H + 3 * R_L | inconclusive |
| Case[9] | 1 | 0 | 0 | 1 | 2 * R_H + 2 * R_L | inconclusive |
| Case[10] | 1 | 0 | 1 | 0 | 2 * R_H + 2 * R_L | inconclusive |
| Case[11] | 1 | 0 | 1 | 1 | 3 * R_H + R_L | inconclusive |
| Case[12] | 1 | 1 | 0 | 0 | 2 * R_H + 2 * R_L | inconclusive |
| Case[13] | 1 | 1 | 0 | 1 | 3 * R_H + R_L | inconclusive |
| Case[14] | 1 | 1 | 1 | 0 | 3 * R_H + R_L | inconclusive |
| Case[15] | 1 | 1 | 1 | 1 | 4 * R_H | conclusive |

TABLE 7 shows a truth table of a post-$1^{st}$-toggle measurement result. Case[7] and case[8] become conclusive. For the rest of the remaining cases, more toggling will be needed.

TABLE 7

| $1^{st}$-toggle | MTJ[3] toggled | MTJ[2] | MTJ[1] | MTJ[0] | Total resistance measured | |
|---|---|---|---|---|---|---|
| Case[1] | 0 → 1 | 0 | 0 | 1 | 2 * R_H + 2 * R_L | inconclusive |
| Case[2] | 0 → 1 | 0 | 1 | 0 | 2 * R_H + 2 * R_L | inconclusive |
| Case[3] | 0 → 1 | 0 | 1 | 1 | 3 * R_H + R_L | inconclusive |
| Case[4] | 0 → 1 | 1 | 0 | 0 | 2 * R_H + 2 * R_L | inconclusive |
| Case[5] | 0 → 1 | 1 | 0 | 1 | 3 * R_H + R_L | inconclusive |
| Case[6] | 0 → 1 | 1 | 1 | 0 | 3 * R_H + R_L | inconclusive |
| Case[7] | 0 → 1 | 1 | 1 | 1 | 4 * R_H | conclusive |
| Case[8] | 1 → 0 | 0 | 0 | 0 | 4 * R_L | conclusive |
| Case[9] | 1 → 0 | 0 | 0 | 1 | R_H + 3 * R_L | inconclusive |
| Case[10] | 1 → 0 | 0 | 1 | 0 | R_H + 3 * R_L | inconclusive |
| Case[11] | 1 → 0 | 0 | 1 | 1 | 2 * R_H + 2 * R_L | inconclusive |
| Case[12] | 1 → 0 | 1 | 0 | 0 | R_H + 3 * R_L | inconclusive |
| Case[13] | 1 → 0 | 1 | 0 | 1 | 2 * R_H + 2 * R_L | inconclusive |
| Case[14] | 1 → 0 | 1 | 1 | 0 | 2 * R_H + 2 * R_L | inconclusive |

TABLE 8 is a truth table of a post-$2^{nd}$-toggle measurement result. Here case[4] and case[11] become conclusive.

TABLE 8

| $2^{nd}$-toggle | MTJ[3] toggled-back | MTJ[2] toggled | MTJ[1] | MTJ[0] | Total resistance measured | |
|---|---|---|---|---|---|---|
| Case[1] | 0 → 1 → 0 | 0 → 1 | 0 | 1 | 2 * R_H + 2 * R_L | Inconclusive |
| Case[2] | 0 → 1 → 0 | 0 → 1 | 1 | 0 | 2 * R_H + 2 * R_L | Inconclusive |
| Case[3] | 0 → 1 → 0 | 0 → 1 | 1 | 1 | 3 * R_H + R_L | Inconclusive |
| Case[4] | 0 → 1 → 0 | 1 → 0 | 0 | 0 | 4 * R_L | Conclusive |
| Case[5] | 0 → 1 → 0 | 1 → 0 | 0 | 1 | R_H + 3 * R_L | Inconclusive |
| Case[6] | 0 → 1 → 0 | 1 → 0 | 1 | 0 | R_H + 3 * R_L | Inconclusive |
| Case[9] | 1 → 0 → 1 | 0 → 1 | 0 | 1 | 3 * R_H + R_L | Inconclusive |
| Case[10] | 1 → 0 → 1 | 0 → 1 | 1 | 0 | 3 * R_H + R_L | Inconclusive |
| Case[11] | 1 → 0 → 1 | 0 → 1 | 1 | 1 | 4 * R_H | Conclusive |
| Case[12] | 1 → 0 → 1 | 1 → 0 | 0 | 0 | R_H + 3 * R_L | Inconclusive |

TABLE 8-continued

| $2^{nd}$-toggle | MTJ[3] toggled-back | MTJ[2] toggled | MTJ[1] | MTJ[0] | Total resistance measured | |
|---|---|---|---|---|---|---|
| Case[13] | 1 → 0 → 1 | 1 → 0 | 0 | 1 | 2 * R_H + 2 * R_L | Inconclusive |
| Case[14] | 1 → 0 → 1 | 1 → 0 | 1 | 0 | 2 * R_H + 2 * R_L | Inconclusive |

TABLE 9 is a truth table of a post-$3^{rd}$-toggle measurement result. Here case[2] and case[13] are outright conclusive. Therefore, after 3 bit toggling, case[0], case[4], case[7], case [8], case[11] and case[15] can be determined by the measured resistance themselves. The rest of the 16 cases have to be determined by checking transition histories of the measured resistance which is shown in TABLE 10. If a transition is unique, its representative case can then be determined. Specifically, case[1] can be determined after 3 toggles, so are case[2], case[5], case[6], case[9], case[10], case[13] and case [14]. Case[3], case[4], case [11] and case[12] can be determined after just 2 toggles. Case[7] and case[8] can be determined after just 1 toggles. And of course, case[0] and case[15] can be determined even in the pre-toggle measurement.

TABLE 9

| $3^{rd}$-toggle | MTJ[3] toggled-back | MTJ[2] toggled-back | MTJ[1] toggled | MTJ[0] | Total resistance measured | |
|---|---|---|---|---|---|---|
| Case[1] | 0 → 1 → 0 | 0 → 1 → 0 | 0 → 1 | 1 | 2 * R_H + 2 * R_L | Inconclusive |
| Case[2] | 0 → 1 → 0 | 0 → 1 → 0 | 1 → 0 | 0 | 4 * R_L | Conclusive |
| Case[3] | 0 → 1 → 0 | 0 → 1 → 0 | 1 → 0 | 1 | R_H + 3 * R_L | Inconclusive |
| Case[5] | 0 → 1 → 0 | 1 → 0 → 1 | 0 → 1 | 1 | 3 * R_H + R_L | Inconclusive |
| Case[6] | 0 → 1 → 0 | 1 → 0 → 1 | 1 → 0 | 0 | R_H + 3 * R_L | Inconclusive |
| Case[9] | 1 → 0 → 1 | 0 → 1 → 0 | 0 → 1 | 1 | 3 * R_H + R_L | Inconclusive |
| Case[10] | 1 → 0 → 1 | 0 → 1 → 0 | 1 → 0 | 0 | R_H + 3 * R_L | Inconclusive |
| Case[12] | 1 → 0 → 1 | 1 → 0 → 1 | 0 → 1 | 0 | 3 * R_H + R_L | Inconclusive |
| Case[13] | 1 → 0 → 1 | 1 → 0 → 1 | 0 → 1 | 1 | 4 * R_H | Conclusive |
| Case[14] | 1 → 0 → 1 | 1 → 0 → 1 | 1 → 0 | 0 | 2 * R_H + 2 * R_L | Inconclusive |

TABLE 10

| | Pre-toggle | $1^{st}$-toggle | $2^{nd}$ toggle | $3^{rd}$ toggle |
|---|---|---|---|---|
| Case[0] | 4 * R_L | | | |
| Case[1] | R_H + 3 * R_L | 2 * R_H + 2 * R_L | 2 * R_H + 2 * R_L | 2 * R_H + 2 * R_L |
| Case[2] | R_H + 3 * R_L | 2 * R_H + 2 * R_L | 2 * R_H + 2 * R_L | 4 * R_L |
| Case[3] | 2 * R_H + 2 * R_L | 3 * R_H + R_L | 3 * R_H + R_L | |
| Case[4] | R_H + 3 * R_L | 2 * R_H + 2 * R_L | 4 * R_L | |
| Case[5] | 2 * R_H + 2 * R_L | 3 * R_H + R_L | R_H + 3 * R_L | 3 * R_H + R_L |
| Case[6] | 2 * R_H + 2 * R_L | 3 * R_H + R_L | R_H + 3 * R_L | R_H + 3 * R_L |
| Case[7] | 3 * R_H + R_L | 4 * R_H | | |
| Case[8] | R_H + 3 * R_L | 4 * R_L | | |
| Case[9] | 2 * R_H + 2 * R_L | R_H + 3 * R_L | 3 * R_H + R_L | 3 * R_H + R_L |
| Case[10] | 2 * R_H + 2 * R_L | R_H + 3 * R_L | 3 * R_H + R_L | R_H + 3 * R_L |
| Case[11] | 3 * R_H + R_L | 2 * R_H + 2 * R_L | 4 * R_H | |
| Case[12] | 2 * R_H + 2 * R_L | R_H + 3 * R_L | R_H + 3 * R_L | |
| Case[13] | 3 * R_H + R_L | 2 * R_H + 2 * R_L | 2 * R_H + 2 * R_L | 4 * R_H |
| Case[14] | 3 * R_H + R_L | 2 * R_H + 2 * R_L | 2 * R_H + 2 * R_L | 2 * R_H + 2 * R_L |
| Case[15] | 4 * R_H | | | |

In light of TABLE 10, the comparing in step 720 of FIG. 7 should actually include comparing resistance transition histories with predetermined transition sequences for determining data stored in MTJ strings, especially when the number of bits in the MTJ strings exceeds 3.

FIG. 9C shows a timing waveform essentially the same as that shown in FIG. 9B except a next toggle in FIG. 9C follows a current toggle-back instead of happening at the same time as shown in FIG. 9B. For instance, a next toggling time 975 follows the current toggle-back time 982. Truth tables, TABLE 6 through TABLE 10 used for a system of FIG. 9B also fit for a system of FIG. 9C.

Figure 10:
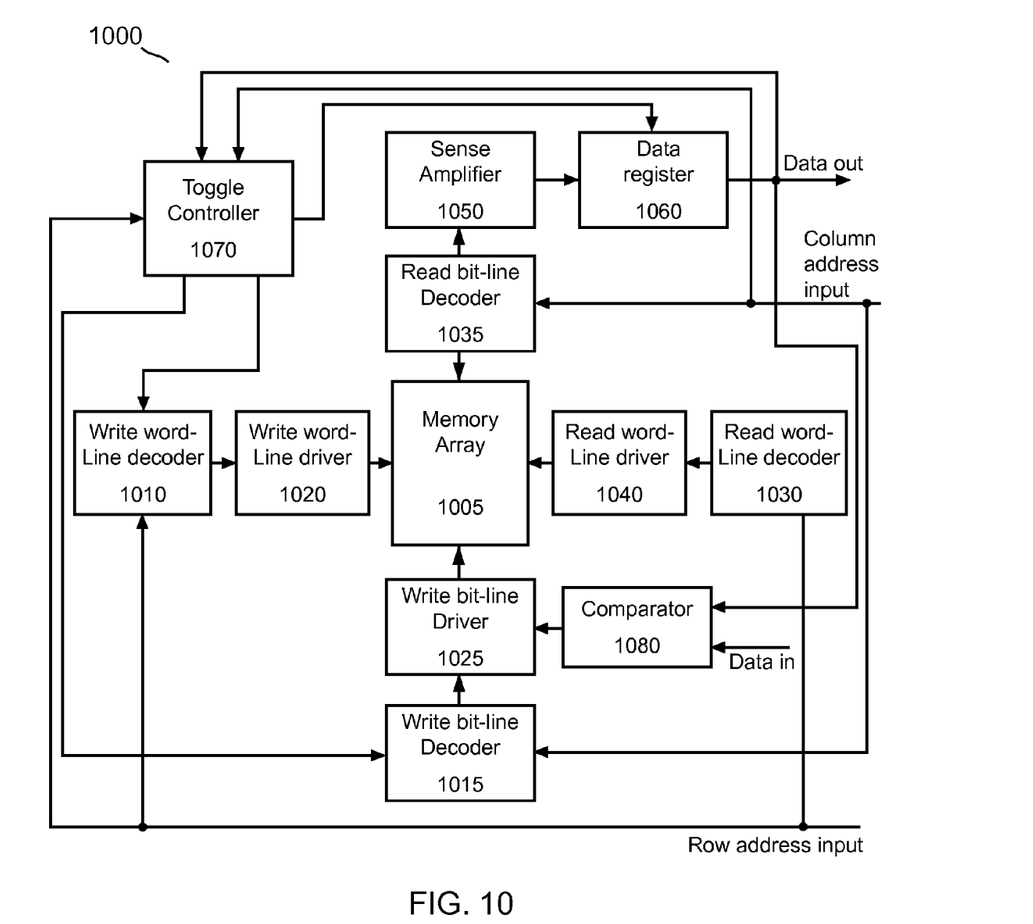
FIG. 10 is a block diagram illustrating various functional blocks of a MRAM implementing the serially connected MTJs.

FIG. 10 is a block diagram illustrating various functional blocks of a MRAM 1000 implementing the serially connected MTJs. A memory array 1005 include arrays of MTJ strings organized either in the form of the array 800 or the array 850. A write circuitry comprises a write word-line decoder 1010 and a write bit-line decoder 1015, both taking row address input. Decoded write word-line and bit-line signals are sent to a write word-line driver 1020 and a write bit-line driver 1025, respectively, for toggling the addressed MTJs. Similarly a read word-line decoder 1030 and a read bit-line decoder 1035 take in column address input. Decoded read word-line signal is sent to a read word-line driver 1040 for turning on an addressed select transistor. Read bit-line decoder 1035 uses decoded read bit-line information to couple an addressed read bit-line to a sense amplifier 1050, which measures resistance level of the addressed MTJ string. The sense amplifier 1050 may use a plurality of reference MTJ strings set to a plurality of predetermined resistance levels, respectively. The reference MTJ strings being structurally substantially identical to the memory string. Then the sense amplifier 1050 compares the MTJ string in the memory array 1005 with the plurality of reference MTJ strings. An output of the sense amplifier 1050 is a measured resistance value of the MTJ string, which does not directly constitute data stored in the addressed MTJ string. A data register 1060 compares the measured resistance value and transition history of the measured resistance values after each toggling with a set of stored values. When a match is found, the data corresponding to the matched value is then the data stored in the addressed MTJ string. If no match is found, a toggle controller 1070 will instruct a next bit of MTJ to be toggled and start another resistance measurement by the sense amplifier 1050. The toggle controller 1070 also controls toggle writing of the MRAM 1000. Since the writing process is essentially to toggle certain bits of MTJs to match a desired data pattern, a read must be performed on the addressed MTJ string prior to every writing to get the existing data. A comparator 1080 compares the existing data with the input data, and controls the write-bit-line driver to allow toggling only on those MTJ bits opposite to the input data.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A memory device manufactured in semiconductor processes comprising:
    a plurality of random access memory (RAM) cells and a select transistor connected in series to form a memory string, each of the plurality of RAM cells toggles among at least two stable resistive levels to represent at least two logic states, respectively;
    a resistance sensing circuit coupled to the memory string for measuring a resistance level thereof;
    an address decoder coupled to a gate of the select transistor for selectively engaging the memory string to the resistance sensing circuit;
    a toggle control circuit configured to selectively toggle at least one of the plurality of RAM cells after a first measurement of the resistance level of the memory string and toggle back the at least one of the plurality of memory cells after a second measurement of the resistance level of the memory string; and
    a logic control circuit coupled to the resistance sensing circuit and the toggle control circuit, and being configured to compare both the first and second measurement results with a plurality of predetermined values and to use the comparison result to determine the data stored in the memory string.

2. The memory device of claim 1 wherein the RAM cells are memory cells selected from the group consisting of magnetic RAM cells and resistive RAM cells.

3. The memory device of claim 1 wherein the select transistor is an NMOS transistor.

4. The memory device of claim 1, wherein a total resistance of the memory string equals substantially to a sum of the individual resistances of the plurality of RAM cells.

5. The memory device of claim 1, wherein the logic control circuit comprises a plurality of registers for storing the first and second measurement results.

6. The memory device of claim 1, wherein the plurality of predetermined values is provided by a plurality of reference strings set to predetermined resistance levels, the reference strings being structurally substantially identical to the memory string.

7. A method for reading two or more random access memory (RAM) cells, the RAM cells and a select transistor being serially connected to form a memory string and each of the RAM cells having at least two stable resistive levels to represent at least two logic states, respectively, the method comprising:
    turning on the select transistor;
    measuring a first resistance of the memory string;
    storing the first resistance;
    toggling a predetermined one of the RAM cells;
    measuring a second resistance of the memory string after the toggling; and
    comparing the first and second resistances with a plurality of predetermined resistance values,
    wherein the comparison result leads to a determination of the data stored in the RAM cells.

8. The method of claim 7, wherein the turning on the select transistor comprises turning off the select transistor after the measuring a first resistance and turning on the select transistor again for the measuring the second resistance.

9. The method of claim 7, wherein the measuring the first or second resistance of the memory string comprises differentiating the first or second resistance with a plurality of predetermined reference resistances.

10. The method of claim 7, wherein the measuring the first or second resistance of the memory string comprises differentiating the first or second resistance with a plurality of predetermined reference resistances.

11. The method of claim 7, wherein the toggling comprises applying magnetic field over the predetermined one of the RAM cells, wherein the RAM cells are magnetic tunnel junctions.

12. The method of claim 7, wherein the comparing comprises comparing a transition history from the first to the second resistance with the plurality of predetermined reference resistances.

13. The method of claim 7 further comprising toggling back the predetermined one of the RAM cells after the measurement of the second resistance.

14. The method of claim 7 further comprising toggling a next predetermined one of the RAM cells when the data stored in the memory string cannot be determined from the first and second resistances.

15. The method of claim 7 further comprising:
  comparing the first resistance with the plurality of predetermined resistance values;
  terminating the reading when the first resistance matches approximately with a predetermined one of plurality of the predetermined resistance values.

16. The method of claim 15, wherein the predetermined one of the plurality of predetermined resistance values is selected from the group consisting of the largest one and the smallest one of the plurality of the predetermined resistance values.

17. A method for reading two or more random access memory (RAM) cells, the RAM cells and a select transistor being serially connected to form a memory string and each of the RAM cells having at least two stable resistive levels to represent at least two logic states, respectively, the method comprising:
  turning on the select transistor;
  measuring a first resistance of the memory string;
  storing the first resistance;
  toggling a predetermined one of the RAM cells;
  measuring a second resistance of the memory string after the toggling;
  comparing the first and second resistances with a plurality of predetermined resistance values; and
  toggling back the predetermined one of the RAM cells after the measurement of the second resistance,
  wherein the comparison result leads to a determination of the data stored in the RAM cells, and the original data is restored after the reading.

18. The method of claim 17, wherein the turning on the select transistor comprises turning off the select transistor after the measuring a first resistance and turning on the select transistor again for the measuring the second resistance.

19. The method of claim 17, wherein the measuring the first or second resistance of the memory string comprises differentiating the first or second resistance with a plurality of predetermined reference resistances.

20. The method of claim 17, wherein the measuring the first or second resistance of the memory string comprises differentiating the first or second resistance with a plurality of predetermined reference resistances.

21. The method of claim 17, wherein the toggling comprises applying magnetic field over the predetermined one of the RAM cells, wherein the RAM cells are magnetic tunnel junctions.

22. The method of claim 17, wherein the comparing comprises comparing a transition history from the first to the second resistance with the plurality of predetermined reference resistances.

23. The method of claim 17 further comprising:
  comparing the first resistance with the plurality of predetermined resistance values;
  terminating the reading when the first resistance matches approximately with a predetermined one of plurality of the predetermined resistance values.

24. The method of claim 23, wherein the predetermined one of the plurality of predetermined resistance values is selected from the group consisting of the largest one and the smallest one of the plurality of the predetermined resistance values.

* * * * *